US006965527B2

(12) United States Patent
Fasoli et al.

(10) Patent No.: US 6,965,527 B2
(45) Date of Patent: Nov. 15, 2005

(54) MULTIBANK MEMORY ON A DIE

(75) Inventors: Luca G. Fasoli, San Jose, CA (US); Roy E. Scheuerlein, Cupertino, CA (US)

(73) Assignee: Matrix Semiconductor, Inc, Santa Clara, CA (US)

( * ) Notice: Subject to any disclaimer, the term of this patent is extended or adjusted under 35 U.S.C. 154(b) by 226 days.

(21) Appl. No.: 10/305,715

(22) Filed: Nov. 27, 2002

(65) Prior Publication Data

US 2004/0100827 A1 May 27, 2004

(51) Int. Cl.[7] .............................................. G11C 16/04
(52) U.S. Cl. .......................... 365/189.01; 365/230.03; 711/156
(58) Field of Search ..................... 365/189.01, 230.03, 365/218; 711/156

(56) References Cited

U.S. PATENT DOCUMENTS

| | | | |
|---|---|---|---|
| 5,671,392 A | * | 9/1997 | Parris et al. ................. 711/148 |
| 6,016,270 A | | 1/2000 | Thummalapally et al. |
| 6,240,040 B1 | | 5/2001 | Akaogi et al. |
| 6,266,293 B1 | | 7/2001 | Miike |
| 6,765,813 B2 | | 7/2004 | Scheuerlein et al. |
| 2002/0031038 A1 | | 3/2002 | Honda et al. |
| 2004/0210729 A1 | * | 10/2004 | Horii et al. .................. 711/156 |

OTHER PUBLICATIONS

AMD,"Am29DL16xD", *16 Megabit (2 M×8-Bit/1 M×16-Bit) CMOS 3.0 Volt-only, Simultaneous Operation Flash Memory.(Publication 21533*, AMD Datasheet,(Jul. 29, 2002), 1-53.

Hiraki, Mitsuru.,et al. ,"A 3.3V 90MHz Flash Memory Module Embedded in a 32b RISC Microcontroller", *1999 IEEE International Solid-State Circuits Conference ISSCC99/Session 8/Paper MP 6.8*, (1999), 116, 117, 453.

Intel,"1.8 Volt Intel Wireless Flash Memory (W18)", *Intel Datasheet 290701-006 Nov. 2002*, 28F320W18, 28F640W18, 28F128W18, (Nov. 2002), 1-102.

Lee, June.,et al. , "A 1.8V 1Gb NAND Flash Memory with 0.12 um STI Process Technology", *ISSC 2002/Session 6/ SRAM and Non-Volatile Memories/6.3 2002 IEEE International Solid-State Circuits Conference*, (2002), 104, 105, 450.

Mills, D.,et al. , "A 3.3V 50MHz Synchronous 16Mb Flash Memory", *1995 IEEE International Solid-State Circuits Conference ISSCC95/Session 7/Flash Memory/Paper TA7.1*, (1995), 120, 121, 348.

Samsung,"64M×8 Bit NAND Flash Memory", *Samsung Electronics Datasheet K9K1208U0A-YCB0, K9K1208U0A-YIB0 Flash Memory*, (Jan. 17, 2001), 1-27.

* cited by examiner

*Primary Examiner*—Anh Phung
*Assistant Examiner*—Toan Le
(74) *Attorney, Agent, or Firm*—Pamela J. Squyres (57) ABSTRACT

A nonvolatile multibank memory on a die with multiple read, write, and erase circuits, allowing more than one bank to be read, written, erased, or tested independently. Such a multibank memory arrangement is used advantageously in a monolithic three dimensional memory formed above a substrate, leaving unused substrate area available in which the additional circuitry and related cache memory can be formed.

65 Claims, 7 Drawing Sheets

MULTIBANK MEMORY ON A DIE

BACKGROUND OF THE INVENTION

Nonvolatile memories are commonly either rewriteable devices, such as charge-storage devices, or one-time programmable devices, such as antifuse devices. Charge storage devices are usually programmed using Fowler-Nordheim tunneling or channel hot electron injection, while programming of antifuse devices requires applying the large voltage required to blow an antifuse. These programming mechanisms are slow and do not become faster as memories shrink, meaning that, as a rule, nonvolatile memories are slower to access than volatile memories. Monolithic three dimensional memories like the ones described in Johnson et al., U.S. Pat. No. 6,034,882, Knall et al., U.S. Pat. No. 6,420,215; and Lee et al., U.S. patent application Ser. No. 09/927,648, filed Aug. 13, 2001, because of the extra distance data must travel to reach upper levels of memory, are slower still.

There is a need, therefore, to improve the access time of nonvolatile memories.

SUMMARY OF THE INVENTION

The present invention is defined by the following claims, and nothing in this section should be taken as a limitation on those claims. In general, the invention is directed to a nonvolatile multibank memory fabricated on a die.

One preferred embodiment provides for a method of writing to memory comprising starting a first write operation to a first bank, and, while the first write operation is ongoing, starting a second write operation to a second bank, wherein the first bank and the second bank comprise nonvolatile memory and are on a die. A related embodiment provides for a method of erasing memory starting a first erase operation on a first bank, and, while that operation is ongoing, starting a second erase operation on a second bank, wherein both banks comprise nonvolatile memory on a die.

Still another embodiment provides for a method of performing self-test, comprising starting a first self-test operation in a first subset of banks, then, while the first operation is ongoing, starting a second self-test operation on a second subset of banks. As in the related embodiments, both subsets of banks comprise nonvolatile memory and are on a die.

An embodiment provides for a memory comprising at least two banks of nonvolatile memory that form a contiguous address space. These banks are on a die; on the same die are at least two write circuits or at least two erase circuits. Other preferred embodiments provide for an electronic device comprising such a memory.

Other preferred embodiments address more complex use of the multibank memory on a die. A preferred embodiment provides for a method using logic to redirect data. This method involves first building a table of redirection pointers, then redirecting a read, write, or erase operation from a destination bank to a hidden bank based on the table of redirection pointers. The logic, the hidden bank, the table, and the destination bank are all on a die, and the destination bank comprises rewriteable memory.

Other embodiments provide for a memory on a card adapted for insertion and removal from a host device. In these embodiments, the memory comprises at least two banks of nonvolatile memory, at least two write circuits or at least two erase circuits, and logic, all on a die. In a first embodiment of this type, the logic translates a complex operation from the host device into two or more read, write, erase, or transfer operations on the die. In another embodiment of this type, the logic controls one or more self-test operations.

Other preferred embodiments provide for implementation of the multibank memory when the memory is formed above a substrate. One embodiment provides for at least two banks of nonvolatile memory and at least two write circuits, all on a die, wherein the banks comprise memory cells, and these cells are formed above a substrate. Another provides for at least two banks of memory with at least two erase circuits, all on a die and comprising memory cells formed above a substrate.

Other preferred embodiments are provided, and each of the preferred embodiments can be used alone or in combination with one another.

The preferred embodiments will now be described with reference to the attached drawings.

DETAILED DESCRIPTION OF THE INVENTION

One possible approach to improve performance of a memory is to allow more than one operation to be performed on it at a time by dividing the memory into multiple independently addressable banks. By duplicating read, write, and erase circuits, any of these operations can be performed in parallel on multiple banks.

Write and erase circuitry generates large voltages, and thus the circuits require substantial area in the substrate. Until now, duplication of such circuits hasn't been designed into nonvolatile memory fabricated on a die in storage devices. (Integrated circuits are fabricated in or on a wafer. The wafer is then diced into discrete pieces, called die, which are then packaged, possibly along with other die, to be used in electronic devices.) The monocrystalline silicon substrate used in most semiconductor devices is expensive, and duplicating write and erase circuits requires using valuable substrate area, which, for nonvolatile memory on a die in storage devices, has been deemed not to be cost-effective.

The monolithic three dimensional memories described in Johnson et al., Knall et al., and Lee et al., however, are built above a substrate, leaving substrate area unused and available for other purposes. Such monolithic three dimensional memories provide an opportunity to duplicate read, write, and erase circuits in the unused substrate, providing parallelism in a cost effective manner, as in the present invention. A multibank nonvolatile memory on a die according to the present invention, however, could be used with a conventional two dimensional memory built in the substrate, if the resulting speed advantages were deemed to be of sufficient value.

In the present invention, there are multiple read, write, and erase circuits on a die, allowing improved parallelism and independent operation. In one embodiment, each bank has its own read, write, and erase circuits, allowing for complete parallelism. This parallelism results in significant improvements in performance.

Memories are often divided into sections. A section of a memory can be called by different names, such as bank, array, sub-array, sub-array group, or segment, and such sections may be grouped together into larger groupings or may include further divisions, or both. Different manufacturers will use these terms differently. It will be understood that the term "bank" as used throughout this specification refers to an independently controllable section of memory.

This discussion uses the terms "read circuit", "write circuit", and "erase circuit." It will be understood by those skilled in the art that the term "read circuit" is a general term intended to refer to the entire collection of devices required to sense the state or content of nonvolatile memory.

Due to the nature of most types of single-transistor nonvolatile memory, there are normally two operations that modify the contents of memory: write and erase. Write is a selective operation, in which the contents of a single cell can be modified at a time, while erase is a block operation; i.e. a block of memory cells is erased at a time. A selective write operation typically changes the state of a cell from an unprogrammed to a programmed state, but a selective operation that changes the state of a memory cell from a programmed to an unprogrammed state would also be referred to as a write operation.

"Write circuit" is a general term intended to refer to the entire collection of circuit devices required to selectively change the state or content of nonvolatile memory to store data, code, or other information. "Erase circuit" is a general term intended to refer to the entire collection of circuit devices required to change the state of a block of nonvolatile memory such that after the erase operation, all of the memory cells in the block are in the same state, typically an unprogrammed state.

In nonvolatile memories, read, write, and erase operations are often more complex than a simple read, write, or erase, and may include built-in verify, retry, preprogram before block erase, and other actions; circuitry to perform these actions, and decoder circuitry, are included in the terms "read circuit", "write circuit", and "erase circuit" as well.

There may also be some overlap between read, write, and erase circuits. A write circuit and an erase circuit, for example, may share a charge pump but be otherwise independent. A read circuit may either operate independently during a read operation or as part of a read-verify procedure making up a write operation.

By duplicating read, write, and erase circuits the multibank memory of the present invention is capable of performing overlapping independent operations to different banks. Existing multibank memories are capable of some parallelism: reading one bank while writing to another, for example. Such memories may also allow a single write operation that spans more than one bank; i.e., allow writing in two banks at a time.

The degree of parallelism and independence in operation between banks provided by the present invention is distinct from these examples. In embodiments in which there is a read, write, and erase circuit for each bank, the present invention allows one of any operation (read, write, or erase) to be performed on any bank, at any time, regardless of what other read, write, or erase operations are taking place concurrently in other banks. In all embodiments, a write circuit, for example, can initiate a write operation to a bank regardless of whether any other write circuits are already performing write operations on other banks, and regardless of when those other write operations may have started.

Each write operation includes data, addresses, and a status. The data is the data to be written, and the addresses are the addresses to which the data is to be written. Status can be expressed as the status of the operation (in process, finished with success, finished with error, etc.), the status of the bank where the data is being written (busy, available, etc.), the status of the write circuit performing the operation (busy, idle, etc.), or a combination. Data, address, and status define a write operation. Two write operations are independent if their data, addresses, and status are independent.

A dual bank memory without duplicated write circuits (not according to the present invention) which allows a single write operation that spans two banks was given earlier. Such a write operation, though taking place in two banks, is a single write operation, with one block of data, one set of addresses, and a single status—the write operation begins, takes place, then finishes.

In contrast, consider, for example, a two-bank memory with two write circuits according to the present invention. A write operation, with data and addresses, is started in a first bank, performed by a first write circuit. The status of the first operation (or of the first bank, or of the first write circuit) is updated and stored. While the first write is ongoing, a second write operation, with different data and different addresses, can be started in a second bank, performed by a second write circuit. (To say an operation is "ongoing" means that it is actually taking place, and has not been stopped or suspended.) The status of the second operation, or bank, or circuit is updated and stored. The data and status have no dependence on each other, and the operations start and finish independently. (Note it is possible that the data and status could, coincidentally, be identical. But there is no dependence; they need not be the same.)

The same holds true for other operations. Read operations include addresses to read from and status; two read operations are independent when the addresses and the status have no dependence on each other and can start and finish independently. Erase operations have addresses to be erased (on block boundaries) and status, and are independent when the addresses and status have no dependence on each other and can start and finish independently. The status is preferably stored on the die.

Note also that "write operation" here refers to the operation in nonvolatile memory. When a write command is issued by the host, for example, data is downloaded to local cache memory, then written from cache to nonvolatile memory. The term "write operation" refers to the programming of nonvolatile memory, so the write operation begins at the time the nonvolatile memory is written, not at the time that data is transferred from the host to the cache.

Similarly, "read operation" refers to the sensing of nonvolatile memory, and "erase operation" refers to the erasing of a block of nonvolatile memory.

Figure 1:
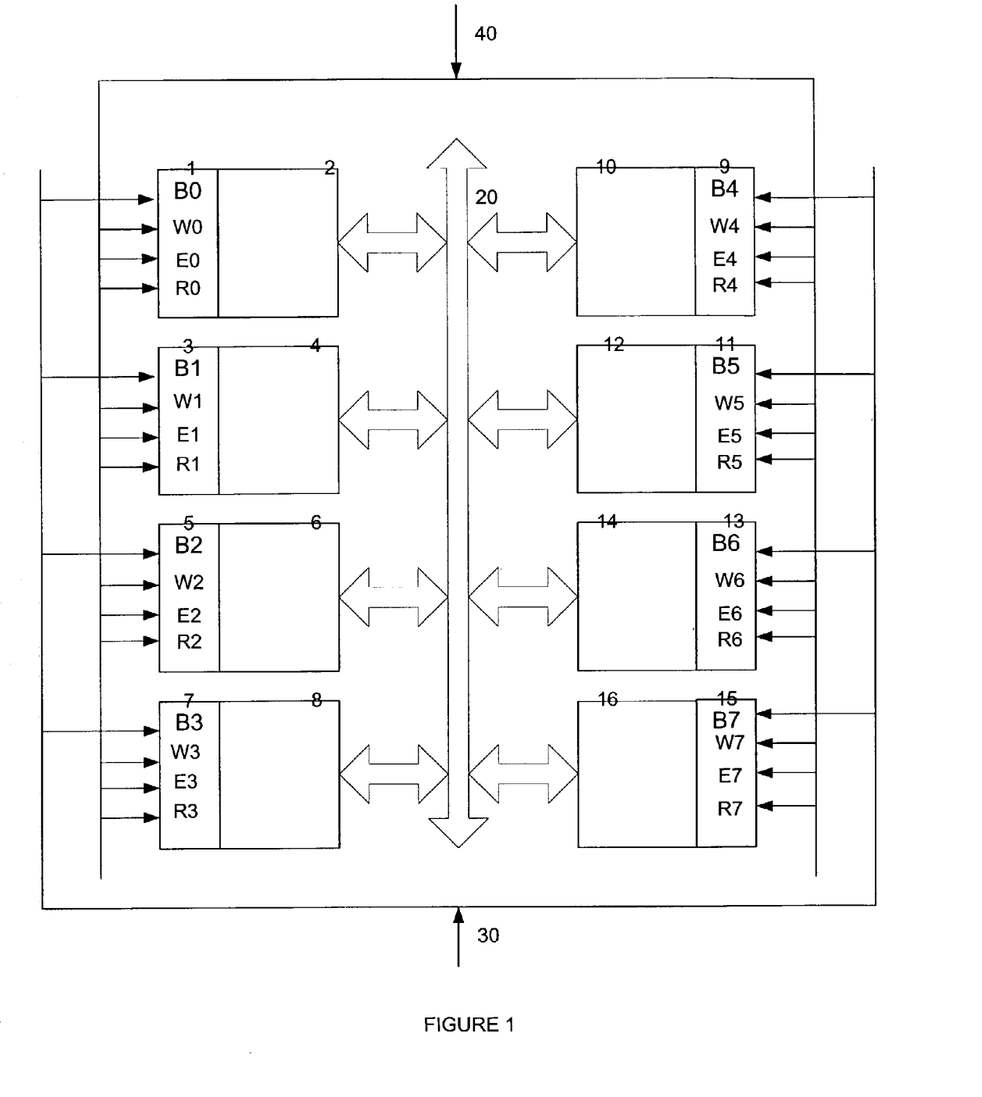
FIG. 1 is an illustration of a multibank memory according to the present invention.

Turning to FIG. 1, the illustration of a multibank nonvolatile memory formed on a die according to the present invention shows a memory with eight independent banks, B0 through B7. Those skilled in the art will appreciate that there may be more or fewer banks; as long as there are at least two, operations can be performed in parallel according to the present invention.

In the embodiment shown, the memory is rewriteable memory, and each bank has a dedicated read circuit (R0 through R7), a dedicated write circuit (W0 through W7), and a dedicated erase circuit (E0 through E7.) Each bank communicates with a common data bus 20, and address bus 30, and a control bus 40.

Other bus configurations can also be employed. The bi-directional data bus 20 shown in FIG. 1, for example, can be replaced by two one-way data buses. The bus configuration chosen, and the width of the buses, are design choices made by balancing requirements for speed versus simplicity of design, and any combination of buses transferring data, addresses, and control information falls within the scope of the present invention.

Status information must be maintained. Information like the error status of a bank and whether or not a bank is available for access, or whether or not a read, write, or erase circuit is available for access, must be stored. Preferably, such information would be stored in each bank itself. This status information can be transferred to the host, or can be stored on the die for retrieval by the host.

In one embodiment, each bank has local storage or cache of some sort to store data that has been read from the bank and is to be transferred to the host, data transferred from the host to be written to the bank, or data to be transferred between banks. Cache will be faster memory, for example SRAM. It should be understood that when a bank is described as communicating with a common bus, that bank may be communicating with the bus through cache memory, or directly.

Different addressing schemes can be employed. A decoding circuit on the die could determine which bank an address or data is intended for, and direct it to the correct bank. Alternatively, three bits of each address (in the case of an eight-bank memory) could be used to identify a bank. For example, an address that begins with the bits "000" would be directed to bank B0, while one with the bits "101" would be directed to bank B5.

In either case, the memory forms a contiguous address space. This is distinct from, for example, two memory modules in a "system on a chip" which have separate address spaces. In the present multibank memory, for example, in a two-bank memory, wherein each bank has $2^{14}$ storage locations, the entire address space can be addressed by the host using 15-bit addresses (14 bits are sufficient to specify all the locations in a bank, and an additional bit distinguishes bank 0 from bank 1.) In contrast, imagine, for example, two memory modules with independent address spaces in which each memory module has $2^{14}$ storage locations. Because the address spaces in the two modules are not contiguous, to address the entire address space represented in the two separate address spaces requires 28 bits: 14 bits for the first module, and another 14 bits for the second.

What follows is an example of the parallel operations possible in a memory on a die in which each bank can be independently read, written, or erased. This example refers to an eight bank memory, B0 through B7, each bank having a read, write, and erase circuit; and the memory having a data bus, an address bus, and a control bus, as shown in FIG. 1. It is assumed that at the beginning of the example, all eight banks are idle.

Suppose the host initiates a write operation to B0. The control bus 40 carries a signal to B0 initiating the write operation. Addresses and data travel on the address bus 30 and the data bus 20. The data to be written is downloaded to B0's local cache 1. The write from B0 cache 1 to B0 nonvolatile memory 2 begins either when the transfer of data to cache is complete or before.

Until the B0 write operation just initiated is finished, B0 is busy, and is not available for any other operation. The control bus 40 transfers a "B0 busy" signal back to the host.

All of the other banks are available, however, so another write operation can be started on B6. A signal travels on the control bus 40 to B6 initiating a write operation. Addresses and data travel on the address bus 30 and data bus 20. The data to be written is downloaded to B6's local cache 13. The write from B6 cache 13 to B6 nonvolatile memory 14 begins either when the transfer of data to cache is complete or before. Once the write to B6 starts, B6 is busy. The control bus 40 transfers a "B6 busy" signal to the host.

While both B0 and B6 operations are proceeding, a signal to read data from B4 travels on the control bus 40. Addresses in B4 to be read from move to B4 on the address bus 30, and the read is initiated. B4 is now busy, and a "B4 busy" signal is transferred to the host on the control bus 40.

Next the control bus 40 carries a signal to perform an erase operation on B3. The addresses for erase travel on the address bus 30, and the erase operation begins. B3 is now busy, and a "B3 busy" signal is transferred to the host on the control bus 40.

In the meantime, the read operation in B4 completes. The control bus 40 moves a "B4 successful completion" signal back to the host. The data read from B4 is uploaded from B4 cache 9 to the host via the data bus 20. When the data upload completes, a "B4 available" signal is transferred on the control bus 40. Next the control bus 40 carries a signal to start an erase operation in B5. The address bus 20 moves addresses to be erased, and the erase operation is initiated. The control bus 40 transfers a "B5 busy" signal to the host.

The preceding example can further illustrate how this multibank memory can be used advantageously with a multiprocessor host or with multiple hosts. In the example given, the transfer of data from B4 cache 9 to the host (following the read from B4 nonvolatile memory 10 to B4 cache 9) had to complete before the signal to start on the erase operation in B5 was sent over the control bus. This limit was on the host side, however: The host was busy receiving the data from B4, and was unable to send the erase command to B5 until it was finished. The control bus and B5, however, were both idle and available for use during that time. If another processor on the host side were available to send the erase command, even greater parallelism could be achieved.

It will be understood that the communication of signals described in the preceding example are merely illustrative; other schemes may be employed. For example, when the read operation on B4 is complete, a signal need not be sent to the host. Instead the "successful completion" status can be stored in the bank for retrieval by the host.

If the entire memory is to be written, by writing to all eight banks at once the time required to perform a write operation is greatly decreased. The control bus 40 carries a write signal to B0, then the data bus 20 and address bus 30 move the data to be written to the B0 cache and initiate a write. A "B0 busy" signal travels back on the control bus 40. While the write on B0 proceeds, the control bus 40 then carries a write signal to B1. The data bus 20 and address bus 30 download data to B1 cache 3, then initiate the write to B1, and B1 is now busy. A write to each bank is initiated in turn, and eight write operations can be in process simultaneously.

Figure 2A:
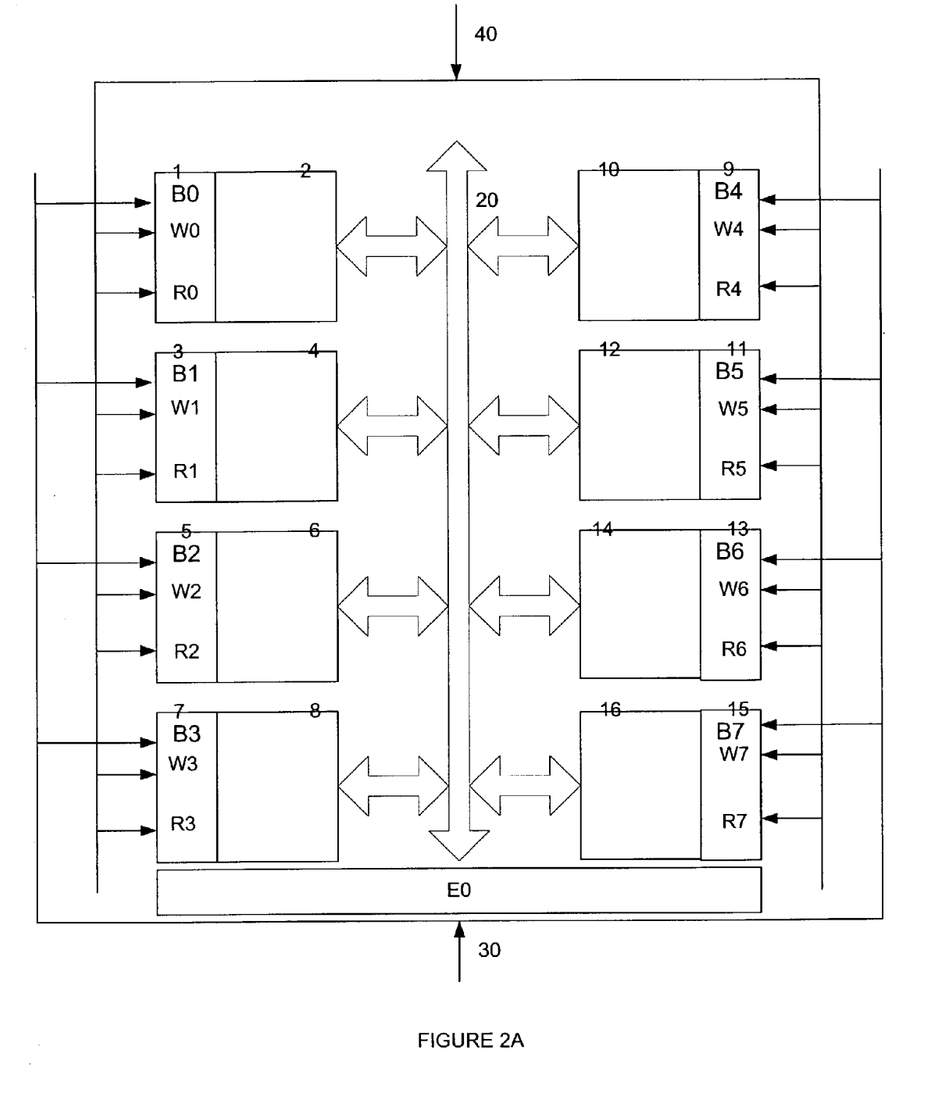
FIG. 2A and FIG. 2B illustrate different possible schemes for sharing read, write and erase circuits.

The embodiments so far have described each bank having its own dedicated read, write, and erase circuit. Other arrangements are possible, and may be desirable for different patterns of use. Turning to FIG. 2A, if read and write operations are anticipated to be frequent but erase is expected to occur rarely, for example, there could be one read and one write circuit per bank, and one cache per bank, but only a single, shared erase circuit E0.

Figure 2B:
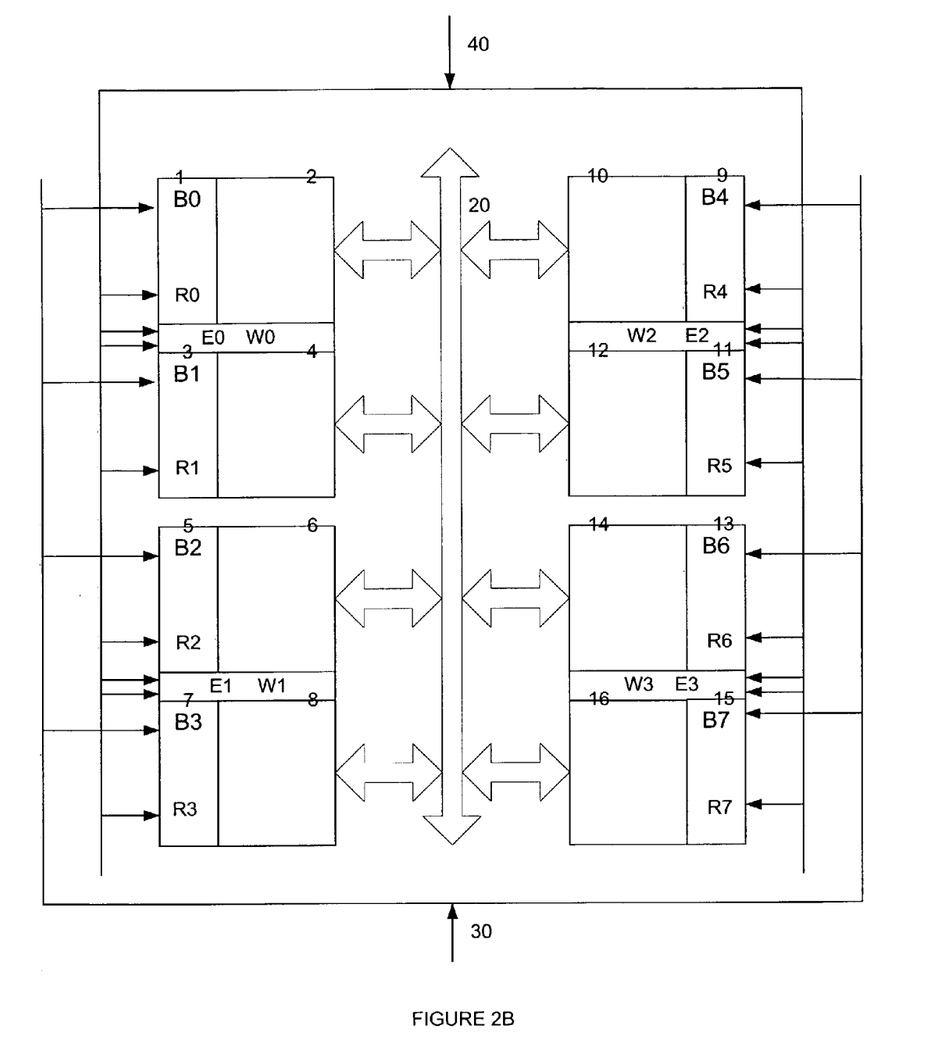

FIG. 2B shows an alternate scheme for sharing circuitry between banks. In this example B0 through B7 each has its own read circuit, while pairs of banks (B0 and B1, B2 and B3, B4 and B5, B6 and B7) share a write circuit and an erase circuit, for a total of four of each. Such a scheme may be desirable if, for example, there is a need to limit the number of program and erase circuits, which generally require more substrate space and more power than read circuits.

In a scheme in which some read, write, and erase circuits are independent and some are shared, there are various control options available. For example, in the arrangement shown in FIG. 2B, when write circuit W0 is writing to B0, B0 is busy. Since W0 is used to write to either B0 or B1, no write operation can be started on B1, even if B1 is idle. The simplest control option would be, whenever a write operation starts on either B0 or B1, to flag both B0 and B1 as busy until the write operation is complete. In one embodiment, though, B1 could be available for read or erase while a write operation takes place in B0. In this case, the status of not only the banks B0 through B7 are maintained, but also the status of each write circuit W0 through W3 and each erase circuits E0 through E3. A write operation can be initiated to a bank only if both the bank and its associated write circuit are not busy. Similarly, an erase operation can be initiated to a bank only if both the bank and its associated erase circuit are not busy.

FIG. 1, FIG. 2A and FIG. 2B show banks with dedicated circuits. It should be understood that it would also be possible to design a multibank memory according to the present invention that has multiple read circuits, multiple write circuits, and/or multiple erase circuits wherein each read, write, and erase circuits is not dedicated to a specific bank. Such a non-dedicated read, write, or erase circuit could be usable by any bank or by a subset of the banks.

Figure 3:
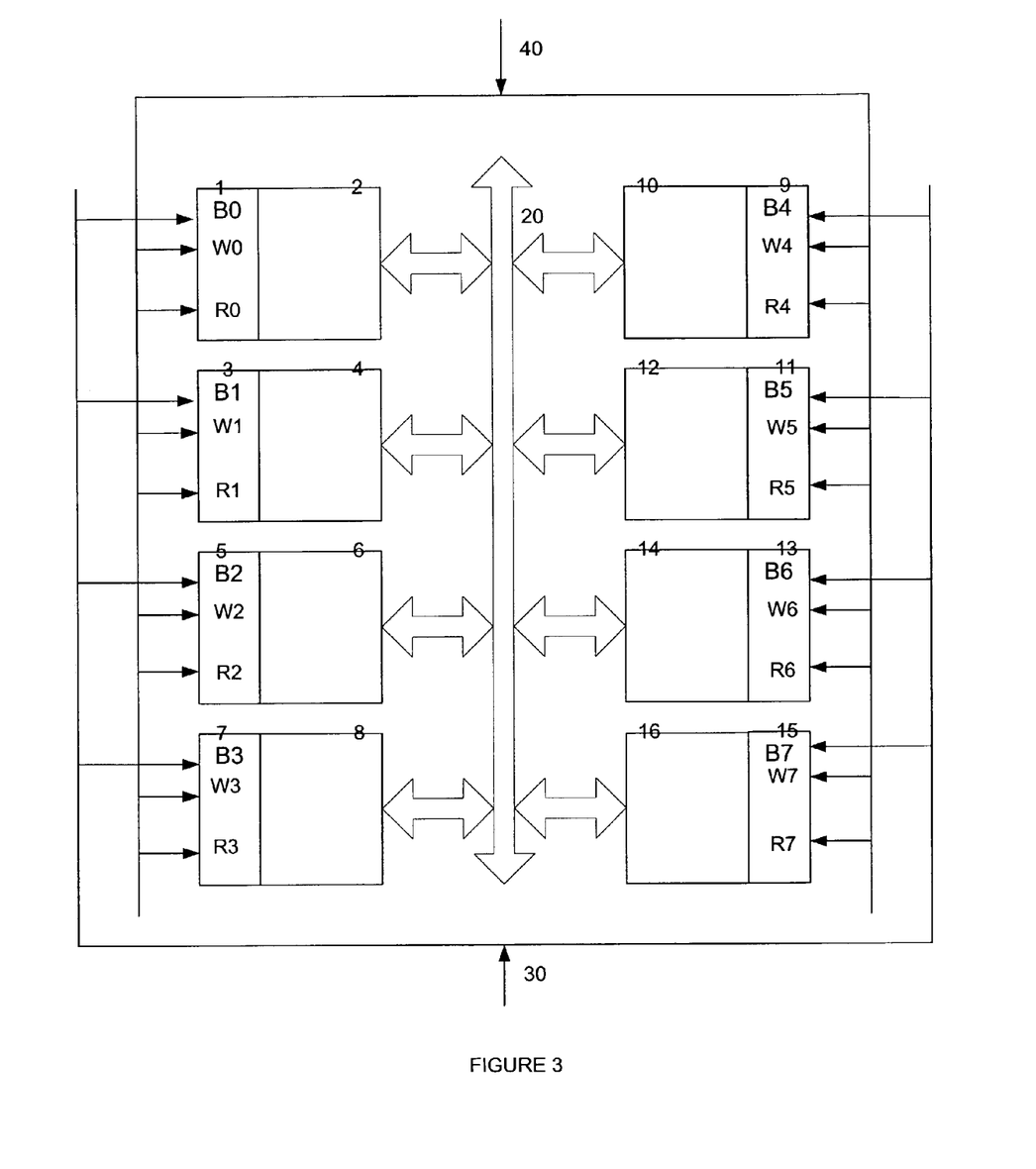
FIG. 3 is an illustration of a write-once multibank memory according to the present invention.

The embodiments discussed so far read, write, and erase banks of rewriteable memory. A multibank scheme could also be used to advantage with a write-once memory as well. Turning to FIG. 3, such a write-once multibank memory could have a read circuit for each bank B0 through B7, allowing reads to take place in parallel. Similarly, program time could be greatly decreased by having a write circuit per bank. Clearly, there would be no erase circuits. In a memory application such as a digital camera, the time taken to record each picture could be greatly reduced by employing such a scheme.

As with the rewriteable memories discussed above, read or write circuits could be dedicated, shared, or switchable, or any combination, with one of each per bank, or fewer, or more.

Figure 4:
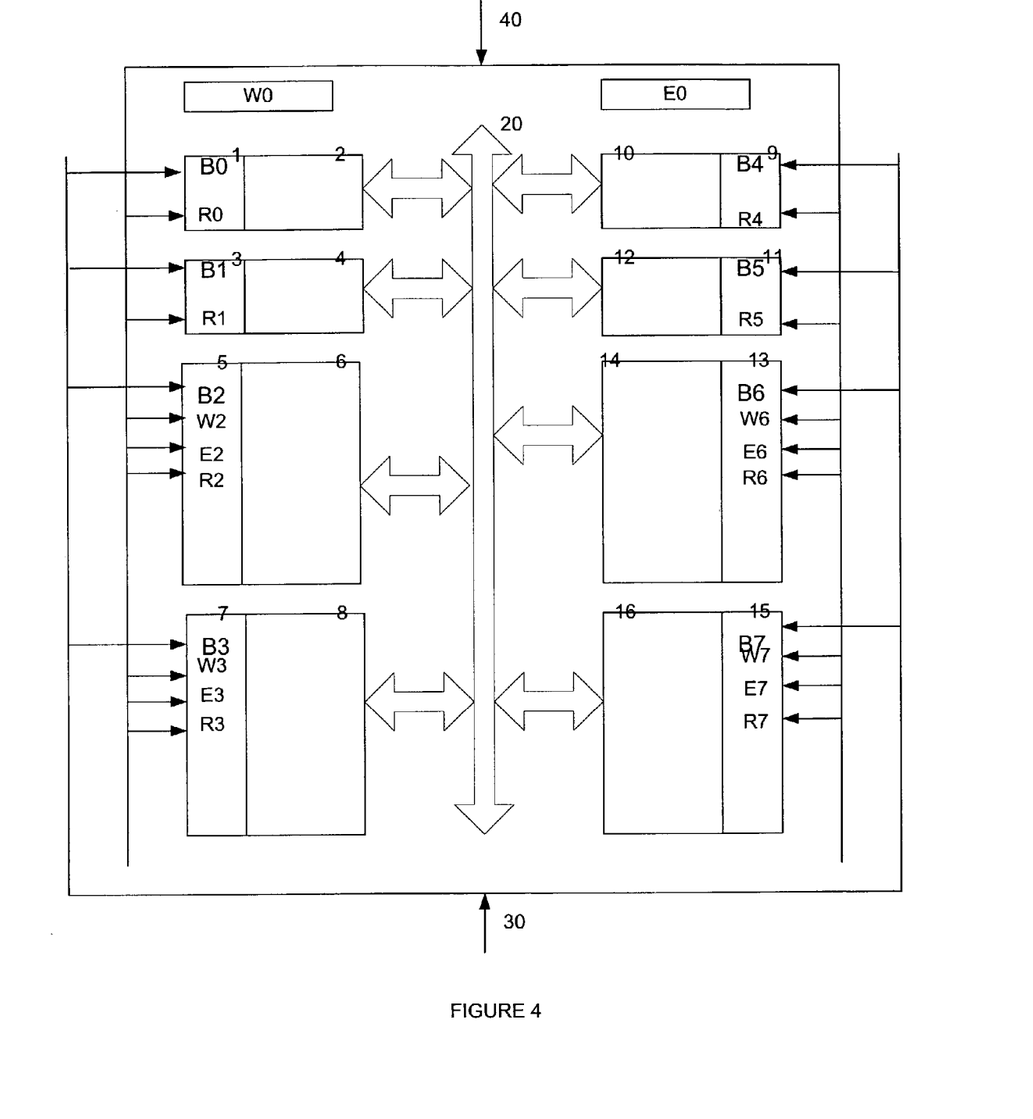
FIG. 4 illustrates a multibank memory with banks of different sizes.

The use of independent banks on a die opens possibilities for creative configurations of the banks to further improve performance. If it is anticipated that code and data will be stored in the multibank memory, for example, the memory could be created with banks of different sizes, as shown in FIG. 4. If appropriate, the smaller banks could be used to store code and while the larger banks store data. Use could further dictate distribution of the read, write, and erase circuits. For example, if the smaller code banks B0, B1, B4, and B5 will be modified infrequently, they could share a single write circuit W0 and a single erase circuit E0, while each of the larger data banks has its own write and erase circuits. Other configurations can be envisioned, depending on the differing requirements of the application.

Figure 5:
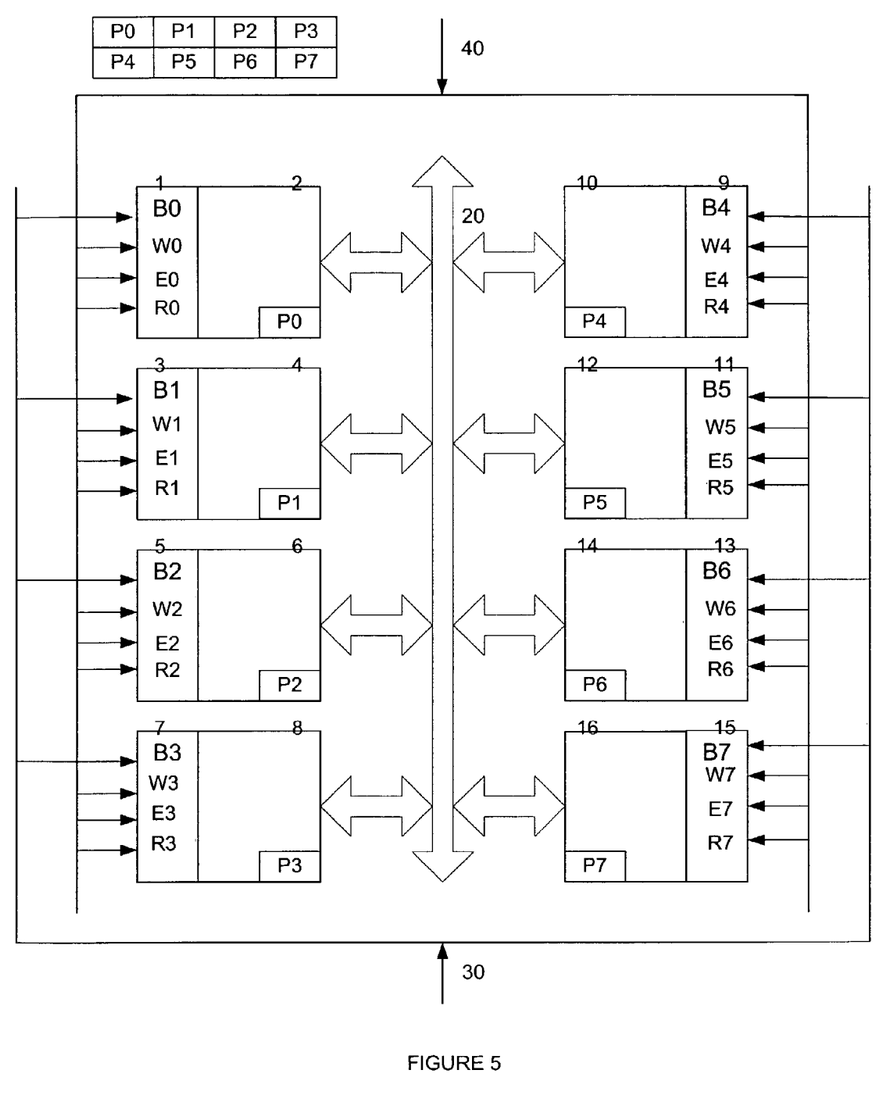
FIG. 5 illustrates logically adjacent addresses distributed across banks to improve performance.

Addressing schemes can take advantage of a multibank architecture by placing logically adjacent blocks of memory in different banks. Suppose, for example, that the memory is always read in pages. As shown in FIG. 5, If each page P can be distributed across eight banks, preferably in equal sized segments, P0, P1, P2, etc., the read and write time can be reduced significantly. Similarly, if a large address area of memory is to be erased at one time, that erase will be faster if the erase blocks are distributed across banks and the erase can be performed by several erase circuits simultaneously.

With additional logic on the die, independently accessible banks make complex operations possible, in which a single operation initiated from the host translates into two or more read, write, erase, or transfer operations on the die. The term "complex operation" is intended to mean a command from the host which cannot be executed on the die as a single read, write, or erase operation, but must instead be translated into two or more of such operations or one or more of such operations and one or more transfers (such a transfer could be from one bank to another, or within a bank, for example.) Logic on the die would be responsible for keeping track of the multiple read, write, and erase operations required to execute the complex operation received from the host. At one extreme, the host need not even be aware of the multibank nature of the memory.

As a first example of a complex operation, consider a "transfer page" operation. The host could direct a page of memory to be transferred to another location within the same bank. This might be done, for example, to consolidate different portions of a fragmented file. A single "transfer page" command travels from the host to the die along with addresses. There the single command translates into a read from nonvolatile memory to associated cache memory followed by a write from cache memory to a different area of nonvolatile memory. The transfer page operation could include a modify step as well, in which the data is modified in cache before it is written to a new location in nonvolatile memory.

Another complex operation which could take place within a bank is a "copy block and erase" operation. Suppose the host directs a block of memory to be copied from one part of a bank to another, then erased in the source area. The single "copy block and erase" command would translate on the die into multiple operations. For example, "copy block and erase" could translate into the following series of operations: read from nonvolatile memory to cache, write from cache to nonvolatile memory, and erase source block. As in the transfer page operation, the copy block and erase operation could include a modify step, in which the data is modified in cache before it is written to nonvolatile memory.

It was noted earlier (as illustrated in FIG. 5) that logically adjacent memory addresses or blocks could reside in different banks to allow parallelism when those addresses or blocks are read, written, or erased. The mapping of logically adjacent memory to physically separate bank memory locations could take place on the host. Alternatively, if there is logic on the die to do so, such mapping could take place on the die. If the logical-to-physical mapping takes place on the die, then read, write, and erase operations could become complex operations. A single write operation initiated from the host, for example, could translate into several write operations taking place in parallel on the die if the locations written to are in different banks.

As another example of a complex operation, it would be possible to reserve one or more banks which are hidden, and not visible to the host. Suppose the host requests a write to a bank, which will be referred to as a destination bank, which is busy with a prior operation, like a write or an erase. Two operations cannot be performed on the same bank at the same time, so one response is to wait until the first operation is finished. Another, more advantageous response would be to write the data to a reserved or hidden bank. A redirection pointer table would be built to keep track of where data intended for a particular address in the destination bank actually resides in the hidden bank. The redirection pointer table could be in either volatile or nonvolatile memory, and could either be part of a hidden bank, in cache associated with the hidden bank, in separate cache, or elsewhere on the die. If, for example, a subsequent read operation attempts to read data from an address that has been redirected, the data is read from the address stored in the corresponding location in the redirection pointer table instead.

When the prior operation to the destination bank is complete and the destination bank is free, the data is transferred from the hidden bank to its intended location in the destination bank using the addresses stored in the redirection pointer table. Clearly such use of a hidden bank as temporary storage until the destination bank is available is only applicable to rewriteable memory.

The steps of determining the status of the destination bank, writing to the hidden bank, and transferring the stored data from the hidden bank to the destination bank can be performed by logic on the die, and thus can be transparent to the host.

This redirection technique can be particularly useful for an erase, which is often the slowest operation. Logic on the die could allow for a background erase, in which the time taken to perform the erase is hidden from the host. For example, referring to FIG. 1, suppose the host requests an erase operation on B3, and the erase operation begins on B3. In a background erase scheme, B3 could immediately report that the erase operation is complete, and B3 is available, even though the erase is in fact still taking place.

Meanwhile, the redirection pointer table could be used to redirect addresses to be erased in B3 to a corresponding area in a hidden bank known to already be in an erased state. Any reads from or writes to the addresses to be erased in B3 would be redirected to the hidden bank until the erase in B3 is finished.

If a read or write operation of a different area in B3 is requested before the erase is finished, the erase operation could be suspended, the read or write performed, and the erase resumed afterward. In this way the time taken to actually perform the erase is invisible to the host.

With logic on the die, independent banks in a multibank memory according to the present invention can increase parallelism of self-test. A self-test operation consists of multiple read, write, or erase operations intended to verify operation of the memory cells. A self-test operation can take place in one or more banks.

Different degrees of parallelism can be envisioned. A single instance of logic can control a self-test operation in all banks. Such logic would initiate read, write, and erase operations, generate test patterns, and perform verification for all the banks it controls. As in prior examples, the read, write, and erase operations can take place independently in each bank.

If further parallelism is desired, multiple instances of such logic can initiate the read, write, and erase operations used in self-test, to generate test patterns, and to perform necessary verification, each for a subset of the total number of banks. In this case, a first self-test operation can be started in a first subset of banks, then, while the first self-test operation is ongoing, a second self-test operation can be started in a second subset of banks, regardless of the state of the first self-test operation, and before the first self-test operation is complete. A "subset of banks" may comprise one or more banks. Depending on the intended use of the memory, self-test can be performed once at manufacture, on every power-up of the device, or at any other more or less frequent intervals. A self-test operation may be initiated by one or more commands from the host, or may originate on the die.

Many other complex operations can be envisioned.

Figure 6A:
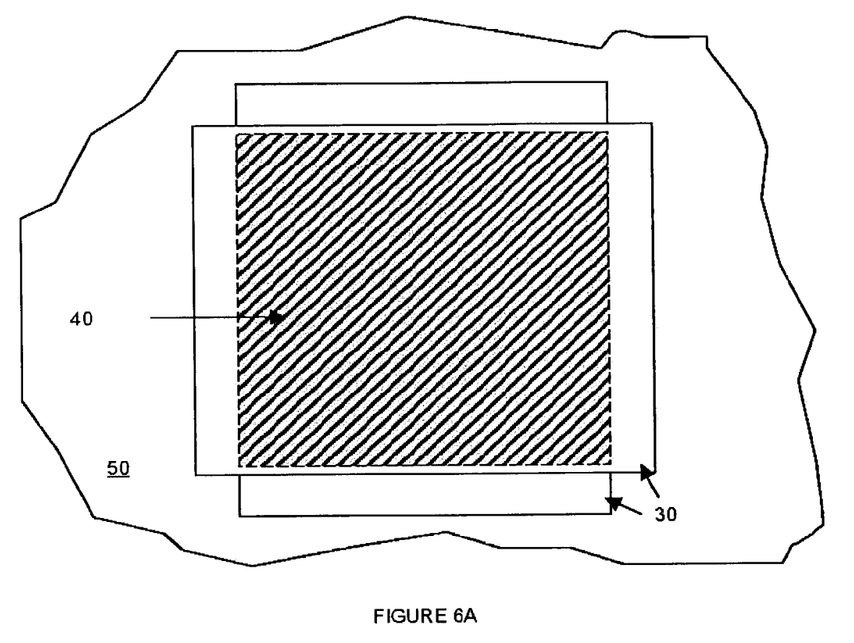
FIG. 6A illustrates a die with three-dimensional memory and support circuitry in the substrate.

The three-dimensional memories described in Johnson et al., Knall et al., and Lee et al., all assigned to the assignee of the present invention, are hereby incorporated by reference. These three-dimensional memories can be used in memory cards adapted for insertion and removal from a host device, such as a camera or a digital recorder. The memories of Johnson et al., Knall et. al., and Lee et al. are built monolithically above a substrate, which is typically but not necessarily of monocrystalline silicon. Such memory requires support circuitry to access the memory cells, which can be formed in the substrate, as shown in FIG. 6a and FIG. 6b.

It should be noted that the phrase "formed in the substrate" should be interpreted as formed in or formed on the substrate. For example, in addition to being formed in the actual substrate, the support circuitry can also be built in silicon-on-insulator (SOI) material, which is the device layer formed on the substrate but electrically isolated from the substrate by a thin isolating layer, by techniques including oxygen implantation or etching to form porous silicon. The support circuitry would be in the one or more layers for SOI devices. Such SOI devices are, therefore, an alternate method of forming the layer of circuitry on the substrate.

Because monolithic three dimensional memory is fabricated above the substrate, unused substrate may remain, allowing other logic or memory to be fabricated there. Such support circuitry could include memory line drivers, row and column decoders, column I/O circuitry, and circuitry used to choose which memory cell to write in/read from/ erase. FIG. 6a shows a die with support circuitry 30 built in the substrate 50; monolithic three dimensional memory 40 (shown shaded) formed above the substrate comprising a plurality of layers of memory cells stacked vertically above one another and above the substrate 50. Beneath the monolithic three dimensional memory 40 is a substrate area, not visible, which can contain read, write, and erase circuits and cache memory according formed in the substrate according to the present invention, as well as other circuits.

Figure 6B:
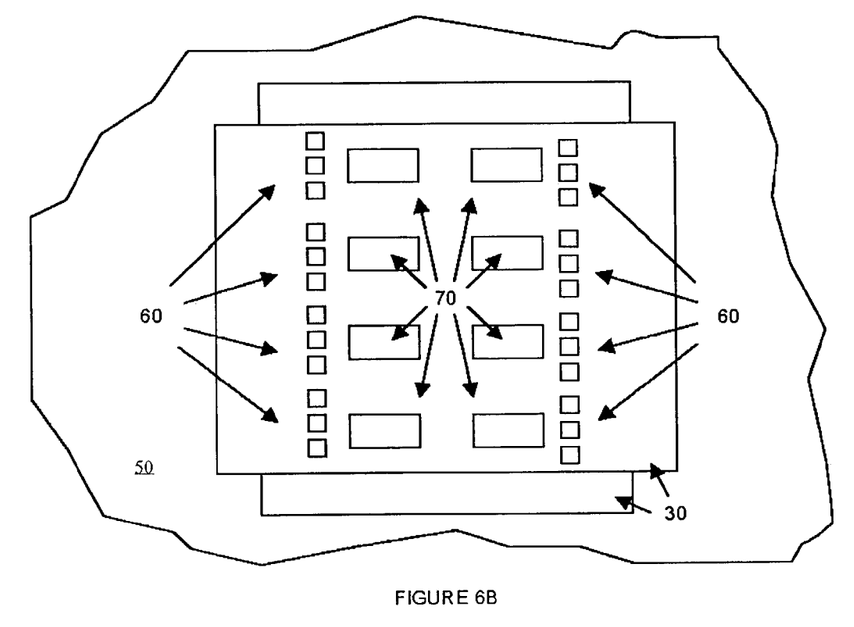
FIG. 6B illustrates the same die with the three-dimensional memory not shown, revealing the substrate.

For clarity, FIG. 6b shows the same die, but with monolithic three dimensional memory 40 removed, revealing the substrate 50, support circuits 30, and the read, write, and erase circuits 60 and cache memory 70 formed in the substrate. Note this illustration of circuits 60 and cache memory 70 is merely representative and is not intended to indicate any actual layout. Layout is a design choice and many configurations are possible.

Clearly, a monolithic three dimensional memory array fabricated above a substrate provides a particularly advantageous setting for a multibank memory according to the present invention, as the unused substrate below the memory array makes inclusion of multiple read, write, and erase circuits on a die more economical than if their inclusion required use of extra substrate adjacent to two-dimensional memory built in the substrate. Nonetheless, the parallelism of a multibank memory like the one described here could benefit any non-volatile memory.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of writing to memory comprising:
    starting a first write operation to a first bank, the first write operation performed by a first write circuit; and
    while the first write operation is ongoing, starting a second write operation to a second bank, the second write operation performed by a second write circuit,
    wherein the first bank and the second bank comprise nonvolatile memory and are on a die, and wherein the first and second write circuits are on the die.

2. The method of claim 1, wherein the banks are all the same size.

3. The method of claim 1, wherein the banks are not all the same size.

4. The method of claim 1, wherein the banks comprise memory cells, said cells formed above a substrate.

5. The method of claim 4, wherein the memory cells comprise polysilicon or amorphous silicon.

6. The method of claim 4, wherein the memory comprises a monolithic three dimensional memory.

7. The method of claim 4, wherein there are at least two erase circuits on the die.

8. A method of erasing memory comprising:
    starting first operation first bank, the first erase operation performed by a first erase circuit; and
    while the first erase operation is ongoing, starting a second erase operation in a second bank, the second erase operation performed by a second erase circuit,
    wherein the first bank and the second bank comprise nonvolatile memory and are on a die, and wherein the first and second erase circuits are on the die.

9. The method of claim 8, wherein the banks are all the same size.

10. The method of claim 8, wherein the banks are not all the same size.

11. The method of claim 8, wherein the banks comprise memory cells, said cells formed above a substrate.

12. The method of claim 11, wherein the memory cells comprise polysilicon or amorphous silicon.

13. The method of claim 11, wherein the memory comprises a monolithic three dimensional memory.

14. A memory comprising:
    at least two banks of nonvolatile memory that form a contiguous address space, said banks on a die, and, on the die,
    at least two write circuits, or
    at least two erase circuits.

15. The memory of claim 14, comprising at least two write circuits on the die.

16. The memory of claim 15, further comprising at least two read circuits on the die.

17. The memory of claim 15, further comprising at least two erase circuits on the die.

18. The memory of claim 15, wherein each bank has a dedicated write circuit.

19. The memory of claim 15, wherein the banks are all the same size.

20. The memory of claim 15, wherein the banks are not all the same size.

21. The memory of claim 15, further comprising means on the die for storing:
    status of any of the banks, or
    status of any write operation, or
    status of any write circuit.

22. The memory of claim 15, wherein each bank has the same data word width.

23. The memory of claim 15, wherein the banks comprise memory cells, said cells formed above a substrate.

24. The memory of claim 23, wherein the memory cells comprise polysilicon or amorphous silicon.

25. The memory of claim 23, wherein the memory comprises a monolithic three dimensional memory.

26. The memory of claim 14, comprising at least two erase circuits on the die.

27. The memory of claim 26, further comprising at least two read circuits on the die.

28. The memory of claim 26, wherein each bank has a dedicated erase circuit.

29. The memory of claim 26, wherein the banks are all the same size.

30. The memory of claim 26, wherein the banks are not all the same size.

31. The memory of claim 26, further comprising means on the die for storing:
    status of any of the banks, or
    status of any erase operation, or
    status of any erase circuit.

32. The memory of claim 26, wherein each bank has the same data word width.

33. The memory of claim 26, wherein the banks comprise memory cells, said cells formed above a substrate.

34. The memory of claim 33, wherein the memory cells comprise polysilicon or amorphous silicon.

35. The memory of claim 33, wherein the memory comprises a monolithic three dimensional memory.

36. An electronic device, comprising:
    a memory comprising:
        at least two banks of nonvolatile memory that form a contiguous address space, said banks on a die, and, on the die,
        at least two write circuits, or
        at least two erase circuits.

37. The device of claim 36, wherein the memory comprises at least two write circuits on the die.

38. The device of claim 37, wherein the banks are all the same size.

39. The device of claim 37, wherein the banks are not all the same size.

40. The device of claim 37, further comprising means on the die for storing:
    status of any of the banks, or
    status of any write operation, or
    status of any write circuit.

41. The device of claim 37, wherein each bank has the same data word width.

42. The device of claim 37, wherein the banks comprise memory cells, said cells formed above a substrate.

43. The device of claim 42, wherein the memory cells comprise polysilicon or amorphous silicon.

44. The device of claim 42, wherein the memory comprises a monolithic three dimensional memory.

45. The device of claim 36, wherein the memory comprises at least two erase circuits on the die.

46. The device of claim 45, wherein the banks are all the same size.

47. The device of claim 45, wherein the banks are not all the same size.

48. The device of claim 45, wherein the banks comprise memory cells, said cells formed above a substrate.

49. The device of claim 48, wherein the memory cells comprise polysilicon or amorphous silicon.

50. The device of claim 48, wherein the memory comprises a monolithic three dimensional memory.

51. A method using logic to redirect data, said method comprising:
   building a table of redirection pointers;
   redirecting a read, write, or erase operation from a destination bank to a hidden bank based on the table of redirection pointers,
   wherein the logic, the hidden bank, the table, and the destination bank are on a die,
   and wherein the destination bank comprises rewriteable nonvolatile memory.

52. The method of claim 51 wherein the die comprises:
   at least two write circuits,
   at least to two read circuits, or
   at least two erase circuits.

53. The method of claim 52, wherein the banks comprise memory cells, said cells formed above a substrate.

54. The method of claim 53, wherein the memory cells comprise polysilicon or amorphous silicon.

55. The method of claim 53, wherein the banks comprise portions of a monolithic three dimensional memory.

56. A memory on a card adapted for insertion and removal from a host device, the memory comprising:
   at least two banks of nonvolatile memory on a die;
   at least two write circuits on the die or at least two erase circuits on the die; and
   logic on the die,
   wherein the logic translates a complex operation from a host into a combination of read, write, erase, or transfer operations on the die.

57. The memory of claim 56 wherein the banks comprise memory cells, said cells formed above a substrate.

58. The memory of claim 57, wherein the memory cells comprise polysilicon or amorphous silicon.

59. The memory of claim 57, wherein the memory comprises a monolithic three dimensional memory.

60. A memory comprising:
   at least two banks of nonvolatile memory on a die; and
   at least two write circuits on the die, wherein
   the banks comprise memory cells, said cells formed above a substrate.

61. The memory of claim 60, wherein the memory cells comprise polysilicon or amorphous silicon.

62. The memory of claim 60, wherein the memory comprises a monolithic three dimensional memory.

63. A memory comprising:
   at least two banks of nonvolatile memory on a die; and
   at least two erase circuits on the die, wherein
   the banks comprise memory cells, said cells formed above a substrate.

64. The memory of claim 63, wherein the memory cells comprise polysilicon or amorphous silicon.

65. The memory of claim 63, wherein the memory comprises a monolithic three dimensional memory.

* * * * *